March 26, 1968 G. PRATT 3,375,466
QUICK STARTING CRYSTAL-CONTROLLED OSCILLATOR
Filed Nov. 22, 1966
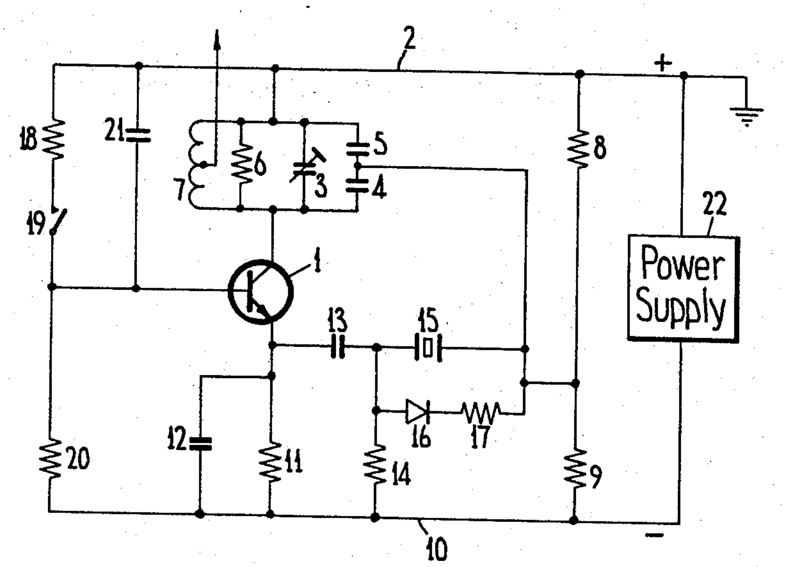
INVENTOR
GEOFFREY PRATT
BY
Kemberton, Kemberton & Meyers
ATTORNEY United States Patent Office 3,375,466

Patented Mar. 26, 1968

3,375,466

QUICK STARTING CRYSTAL-CONTROLLED OSCILLATOR

Geoffrey Pratt, Bulkington, near Nuneaton, England, assignor to The General Electric Company Limited, London, England, a British company Filed Nov. 22, 1966, Ser. No. 596,293
Claims priority, application Great Britain, Nov. 26, 1965, 50,349/65
4 Claims. (Cl. 331—116)

ABSTRACT OF THE DISCLOSURE

In an electric oscillator circuit the frequency of which is determined normally by a piezoelectric crystal connected in a positive feedback path, a rectifier element is connected in parallel with the crystal. This rectifier element is arranged to be forward biased for a short period following switch-on of the oscillator so as to short out the crystal and allow the amplitude of oscillation to build up rapidly at approximately the right frequency, as determined by a relatively low Q tuned circuit.

This invention relates to electric oscillators.

The invention is particularly concerned with electric oscillators of the type in which the oscillation frequency thereof is determined in normal operation by a piezoelectric crystal. Since a piezoelectric crystal has in general a very high "Q-factor" the amplitude of oscillation in a crystal-controlled oscillator takes an appreciable time to reach its full value following initial energization of the oscillator. This can be a serious disadvantage, especially where the oscillator is required to act as a standby source of a frequency-reference signal, as in the case of a carrier reinsertion oscillator in a carrier communication system.

It is an object of the present invention to provide an electric oscillator in which the build up of the amplitude of oscillation is more rapid than that of known crystal controlled oscillators.

According to the present invention, in an electric oscillator the oscillation frequency of which is determined in normal operation by a piezoelectric crystal, there are provided an inductance-capacitance network tuned to approximately the resonant frequency of said crystal, asymmetrically-conducting means connected in circuit with said crystal, and biasing means arranged so to bias said asymmetrically-conducting means that upon energization of the oscillator said asymmetrically-conducting means presents such an impedance that said crystal is rendered ineffective and the frequency of oscillation of the oscillator is then determined mainly by said inductance-capacitance network while subsequently the impedance presented by said device is automatically changed so that the crystal then takes over control of the oscillation frequency.

Preferably said piezoelectric crystal is connected as a series element in a frequency-determining feedback path in said oscillator, and said asymmetrically-conducting means is connected in parallel with said crystal.

An electric oscillator in accordance with the present invention will now be described by way of example with reference to the accompanying drawing, which shows the circuit diagrammatically.

Referring to the drawing, the oscillator includes an n-p-n junction transistor 1 the collector electrode of which is connected to a positive supply line 2 by way of a capacitor 3, capacitors 4 and 5 in series, a resistor 6 and a tapped inductor 7, all in parallel. Resistors 8 and 9 are connected in series between the positive supply line 2 and a negative supply line 10 to form a potential divider, and the junction between the capacitors 4 and 5 is connected directly to the junction between the resistors 8 and 9. The emitter electrode of the transistor 1 is connected to the negative supply line 10 by way of a resistor 11 in parallel with a capacitor 12 of small value and by way of a capacitor 13 and a resistor 14 in series connected in that order. The junction between the capacitor 13 and the resistor 14 is connected to the junction between the resistors 8 and 9 by way of a piezoelectric crystal 15 and by way of a rectifier element 16 and a resistor 17 in series, the anode of the rectifier element 16 being connected to the junction between the capacitor 13 and the resistor 14.

There are provided means selectively to forward bias the base-emitter junction of the transistor 1, this means being represented by a potential divider comprising resistor 18, switch contacts 19 and a resistor 20 connected between the supply lines 2 and 10. The switch contacts 19 may be replaced by a transistor switching circuit (not shown). The base electrode of the transistor 1 is also connected to the supply line 2 by way of a capacitor 21. An output signal may be derived, in operation of the oscillator, from the tapping point on the tapped inductor 7.

In operation a potential difference of, say, twelve volts is maintained between the positive supply line 2 and the negative supply line 10 by a power supply 22.

The oscillator may be prevented from operating by holding the contacts 19 open, thereby applying a substantially zero bias across the base-emitter junction of the transistor 1. When an output oscillatory signal is required the potential of the base electrode of the transistor 1 is made positive (or more positive) with respect to the negative supply line 10 by closing the contacts 19, so that the transistor 1 conducts and a more positive potential is developed at the emitter electrode of the transistor 1 due to current flow through resistor 11. This positive-going change of potential is transmitted by the capacitor 13 to the anode of the rectifier element 16, which is thereby forward biased so as to present a relatively low impedance shunting the crystal 15.

As soon as the transistor 1 starts to conduct random noise voltages in the tuned circuit formed by the tapped inductor 7 and capacitors 3, 4 and 5 initiate oscillation, energy being fed back to the emitter circuit of the transistor 1 from the collector circuit thereof by way of the forward-biased rectifier element 16. Since at this time the crystal 15, which may have a "Q-factor" of ten thousand or more, is effectively shorted out the frequency of oscillation is determined by the tuned circuit, which has a fairly low "Q-factor," say of the order of ten, so that the oscillations build up rapidly in amplitude. By adjustment of the value of the capacitor 3 the resonant frequency of the tuned circuit is arranged to lie close to that of the crystal 15.

As the capacitor 13 charges by way of the rectifier element 16 and the resistors 9 and 17 and the resistor 14, the forward bias voltage across the rectifier element 16 falls, and because of the consequent increase in the impedance presented by the rectifier element 16 an oscillatory signal of increasing amplitude is applied across the crystal 15, causing it to oscillate. After a few hundred cycles of oscillation during which the amplitude of oscillation in the crystal 15 builds up the rectifier element 16 is made non-conducting by the charging of the capacitor 13, the crystal 15 takes over as the feedback path, and the oscillator becomes crystal-controlled.

I claim:

1. An electric oscillator comprising an amplifier element, a piezoelectric crystal, an inductance-capacitance network tuned to substantially the resonant frequency of said crystal, means connecting the inductance-capacitance network as a load impedance for said amplifier element, means connecting the crystal in a path from the output to the input of said amplifier element to provide positive feedback across that element, asymmetrically conducting means, means connecting said asymmetrically conducting means in parallel with said crystal in said path, power supply means, means including switch means connecting said amplifier element to said power supply means for selectively rendering said amplifier element operative in dependence upon the state of said switch means, means to derive from said power supply in normal operation of the circuit a reverse bias for said asymmetrically conducting means, means to apply said bias across said asymmetrically conducting means such as to render said means substantially non-conducting, and means responsive upon operation of said switch means to apply to said asymmetrically conducting means an additional bias voltage such as to forward bias said means for a period of a plurality of cycles of oscillation of said oscillator following operation of said switch means whereby said piezoelectric crystal is effectively short circuited for said period.

2. An electric oscillator in accordance with claim 1 wherein the amplifier element is a transistor.

3. An electric oscillator circuit in accordance with claim 2 wherein the means to apply the additional bias voltage comprises a resistor connected between the emitter electrode of the transistor and one pole of the power supply means and a capacitor connected between said emitter electrode and one terminal of the asymmetrically conducting means, the period being determined by the charging time of said capacitor.

4. An electric oscillator in accordance with claim 2 wherein the switch means is connected in the base electrode circuit of the transistor.

No references cited.

ROY LAKE, *Primary Examiner.*

S. H. GRIMM, *Assistant Examiner.*